US008849364B2

(12) United States Patent
Boffo et al.

(10) Patent No.: US 8,849,364 B2
(45) Date of Patent: Sep. 30, 2014

(54) HIGH-TEMPERATURE SUPERCONDUCTOR MAGNET SYSTEM

(75) Inventors: Cristian Boffo, Wuerzburg (DE); Thomas Gerhard, Hoechberg (DE)

(73) Assignee: Babcock Noell GmbH, Wuerzburg (DE)

( * ) Notice: Subject to any disclaimer, the term of this patent is extended or adjusted under 35 U.S.C. 154(b) by 88 days.

(21) Appl. No.: 13/812,915

(22) PCT Filed: Jul. 30, 2010

(86) PCT No.: PCT/EP2010/004656
§ 371 (c)(1),
(2), (4) Date: Jan. 29, 2013

(87) PCT Pub. No.: WO2012/013205
PCT Pub. Date: Feb. 2, 2012

(65) Prior Publication Data

US 2013/0130914 A1 May 23, 2013

(51) Int. Cl.

| | |
|---|---|
| ***H01F 6/00*** | (2006.01) |
| ***H01B 12/00*** | (2006.01) |
| ***H01L 39/24*** | (2006.01) |
| ***G21K 1/093*** | (2006.01) |
| ***H05G 2/00*** | (2006.01) |
| ***H05H 7/04*** | (2006.01) |
| ***H01F 6/06*** | (2006.01) |

(52) U.S. Cl.
CPC *H01F 6/06* (2013.01); *G21K 1/093* (2013.01); *H05G 2/00* (2013.01); *H05H 7/04* (2013.01)
USPC .......................................................... 505/211

(58) Field of Classification Search
CPC .......... H01F 6/06; H01F 6/00; G01R 33/3815
See application file for complete search history.

(56) References Cited

FOREIGN PATENT DOCUMENTS

DE 10 2007 010 414 9/2008

OTHER PUBLICATIONS

Tanabe, T. et al., "Insertion Devices R&Ds for NSLS-II," 22$^{nd}$ Particle Accelerator Conference, [Online], Jun. 29, 2007, pp. 1-5, XP009146387, Retrieved from the Internet: URL: http://www.bnl.gov/isd/documents/36632.pdf>. (ISR) (Spec, p. 7—see Preliminary Amendment).

Tanabe et al., "Insertion device activities for NSLS-II," Nuclear Instruments and Methods in Physics Research, Section A: Accelerators, Spectrometers, Detectors and Associates Equipment, Elsevier, Amsterdam, NL, vol. 582, No. 1, Oct. 20, 2007, pp. 31-33, XP022308062. (ISR) (Spec, p. 3—see Preliminary Amendment).

(Continued)

*Primary Examiner* — Colleen Dunn
(74) *Attorney, Agent, or Firm* — Collard & Roe, P.C.

(57) ABSTRACT

The invention relates to a high-temperature superconductor (HTS) magnet system, preferably for an insertion device for generation of high-intensity synchrotron radiation, consisting of the coil body (6), on the mantle surface of which poles with windings that lie between them are disposed, wherein at least one high-temperature superconductor strip (23) is wound onto the coil body (6) in one direction, and adjacent winding packages or sections are electrically connected with one another in such a manner that the current flow runs in opposite directions, in each instance. The solution according to the invention has the advantage of a simplified winding process, whereby individual coil pairs can be replaced, if necessary, by means of the modular arrangement. The scheme can be applied to every possible configuration of an insertion device, and is therefore also suitable for use in so-called free electron lasers and other light sources based on particle accelerators. Furthermore, complicated cooling is eliminated, so that safety problems caused by lack of cooling cannot occur.

6 Claims, 3 Drawing Sheets

(56) References Cited

OTHER PUBLICATIONS

Figure 1:
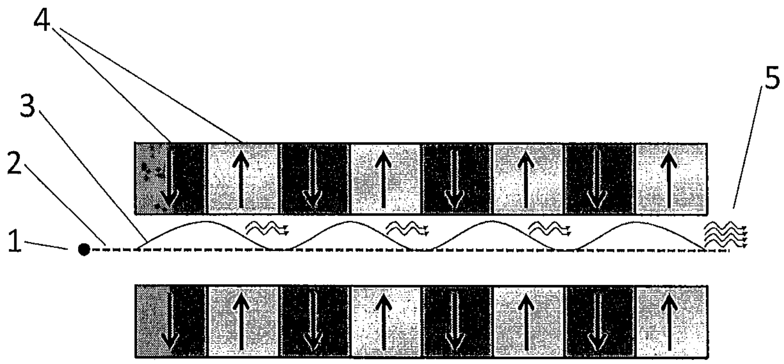

Tanaka, T. et al., "Development of cryogenic permanent undulators operating around liquid nitrogen temperature," New Journal of Physics, Institute of Physics Publishing, Bristol, GB, vol. 8, No. 11, Nov. 1, 2006, 287, cover page and pp. 1-16, XP020107603. (ISR).

Toshiteru, Kii et al., "Proposal of a Bulk HTSC Staggered Array Undulator," AIP Conference Proceedings, American Institute of Physics, New York, US, vol. 1234, Jan. 1, 2009, pp. 539-542, XP009146401. (ISR).

Wollmann, D. et al., "Experimental demonstration of the induction-shimming concept in superconductive undulators," Physical Review Special Topics, Accelerators and Beams, American Physical Society, Ridge, NY, US, vol. 12, No. 4, Apr. 23, 2009, pp. 40702/1-6, XP009146377. (ISR).

Sasaki, M. et al., "Development of superconducting wiggler at nirs," Proceedings of EPAC 2002, Jan. 1, 2002, pp. 2442-2444, XP009146509. (ISR).

Fedurin, M. et al., "Upgrade alternatives for the nsls superconducting wiggler," Proceedings of the 2001 Particle Accelerator Conference, Chicago, Jun. 25, 2007, pp. 1335-1337, XP031227839. (ISR).

Sugiyama, S. et al., "The operation of a superconducting wiggler at TERAS," Journal of Synchrotron Radiation, Wiley-Blackwell Munksgaard, DK, vol. 5, Jan. 1, 1998, pp. 437-439, XP009146356. (ISR).

"Trends in the Development of insertion devices for a future synchrotron light source," C.S. Hwang, C.H. Chang, NSRRC, Hsinchu, Taiwan, Proceedings IPAC 2010, pp. 50-54. (Spec, p. 2).

"Fabrication of the new superconducting undulator for the ANKA synchrotron light source," C. Boffo, W. Walter, Babcock Noell GmbH, Würzburg, Germany, T. Baumbach, S. Casalbuoni, A. Grau, M. Hagelstein, D. Saez de Jauregui, Karlsruhe Institute of Technology, Karlsruhe, Germany, Proceedings IPAC 2010), pp. 3135-3137. (Spec, p. 3).

"Heat load issues of superconducting undulator operated at TPS storage ring," J.C. Jan, C.S. Hwang and P.H. Lin, NSRRC, Hsinchu, Taiwan "Proceedings EPAC 2008", pp. 2267-2269. (Spec, p. 4).

"Measurements of the beam heat load in the cold bore superconductive undulator installed at ANKA," S. Casalbuoni, A. Grau, M. Hagelstein, R. Rossmanith, Forschungszentrum Karlsruhe [Karlsruhe Research Center], Germany, F. Zimmermann, CERN, Geneva, Switzerland, B. Kostka, E. Mashkina, E. Steffens, University of Erlangen, Germany, A. Bernhard, D. Wollmann, T. Baumbach, University of Karlsruhe, Germany, Proceedings PAC 2007, pp. 968-970. (Spec, p. 4-5).

International Search Report of PCT/EP2010/004656, Apr. 7, 2011.

HIGH-TEMPERATURE SUPERCONDUCTOR MAGNET SYSTEM

CROSS REFERENCE TO RELATED APPLICATIONS

This application is the National Stage of PCT/EP2010/004656 filed on Jul. 30, 2010, the disclosure of which is incorporated by reference. The international application under PCT article 21(2) was not published in English.

The invention relates to a high-temperature superconductor (HTS) magnet system, preferably for an insertion device for generation of high-intensity synchrotron radiation in accordance with the characteristics of the first claim. However, the apparatus is not restricted to this use, but rather can also be used for all other suitable application cases.

In synchrotron light sources, so-called insertion devices, undulators and wigglers, are used to produce highly brilliant radiation, which is used for many different types of experiments. These apparatuses generate a periodically alternating magnetic field on the beam axis, whereby the period length is precisely defined. While the electrons pass through the field, they are forced onto an oscillating trajectory by this field configuration, and thereby emit synchrotron radiation (FIG. 1). In the special case of an undulator, the period length of the magnetic field is precisely adapted to the wavelength of the synchrotron radiation. This leads to stimulated emission, which generates coherent light in a very narrow bandwidth. Because of the periodically transversal oscillation of the particles, the resulting spontaneous emission is mainly coherent and has a narrow spectral line length, as described in "*Trends in the Development of insertion devices for a future synchrotron light source,*" C. S. Hwang, C. H. Chang, NSRRC, Hsinchu, Taiwan, *Proceedings IPAC* 2010.

Figure 2:
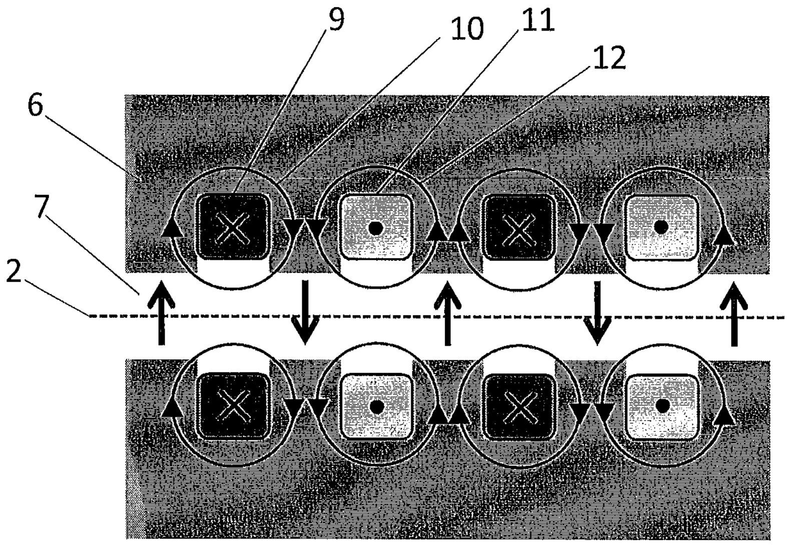

Undulators and wigglers are constructed from permanent magnets and electromagnets. A winding body for an electromagnetic undulator is described in DE 10 2007 010 414 A1, whereby in this document, the method of production of an HTS-based magnet coil arrangement for generation of the desired field is not discussed. In this connection, two yokes are oriented relative to one another in such a manner that they lie symmetrical to the beam axis of the electron beam and generate the desired field. The use of permanent magnets for undulators and wigglers goes back to the first prototypes. In the case of electromagnets, above all, the magnetic flow is guided through the poles, in that current is made to flow through the adjacent coils in opposite directions (FIG. 2). In comparison with electromagnets, permanent magnet undulators are the most widespread solution, but are limited in terms of their maximal field.

In contrast, superconductive insertion devices (SCU) achieve higher magnetic fields and thereby allow a higher electron flow and/or higher photon energies than permanent-magnet systems, and this is desirable for future experiments. Multiple superconductive insertion devices have been built, up to now, but their coils are produced from low-temperature superconductors (LTS) niobium-titanium (NbTi) as a standard feature. ("Fabrication of the new superconducting undulator for the ANKA synchrotron light source," C. Boffo, W. Walter, Babcock Noell GmbH, Würzburg, Germany, T. Baumbach, S. Casalbuoni, A. Grau, M. Hagelstein, D. Saez de Jauregui, Karlsruhe Institute of Technology, Karlsruhe, Germany, Proceedings IPAC 2010). In order to achieve an even greater magnetic flow and thereby a higher magnetic field, the use of other superconductors such as $Nb_3Sn$ or HTS is proposed. Experiments with test pieces or first short prototypes are being conducted and are described in "Insertion device activities for NSLS-II," T. Tanabe, D. A. Harder, S. Hulbert, G. Rakowsky, J. Skaritka, National Synchrotron Light Source-II, Brookhaven National Laboratory, Upton, New York, USA, Nuclear Instruments and Methods in Physics Research A 582 (2007), pages 31-33.

The coils are mainly wound from a continuous conductor, if possible, linked with one another, with only a few interruptions. Interruptions are avoided because heat frequently occurs at them, which means additional thermal loads for the system. This means a great effort for the winding process, because the coils must be wound in different directions, in each instance, during this process, in order to generate the alternating magnetic field. Fundamentally, these LTS coils, which are therefore also protected by means of cold shields, particularly toward the outside, must be cooled to cryogenic temperatures around 4 K, typically with cryocoolers. With everything that has the lowest temperature in the cryostat, they form the so-called "cold mass." Cryocoolers are refrigerators having a closed cooling circuit, by means of which it is possible to reach cryogenic temperatures, and by means of which bath cooling with liquid helium can be circumvented, greatly simplifying the use of the magnet. Commercial systems produce up to 1.5 W cooling output at a temperature of 4.5 K. The cooling output is greatly dependent on the operating temperature of the application to be cooled. The higher the operating temperature, the greater the available cooling output.

A problem that relates to the solution for superconductive insertion devices is working with the heat input at cryogenic temperatures that is generated by the wave motion of the electron beam. The entire heat amount of a beam of a third-generation synchrotron source can amount to more than 10 W, according to "*Heat load issues of superconducting undulator operated at TPS storage ring,*" J. C. Jan, C. S. Hwang and P. H. Lin, NSRRC, Hsinchu, Taiwan "*Proceedings EPAC* 2008" and "*Measurements of the beam heat load in the cold bore superconductive undulator installed at ANKA,*" S. Casalbuoni, A. Grau, M. Hagelstein, R. Rossmanith, Forschungszentrum Karlsruhe [Karlsruhe Research Center], Germany, F. Zimmermann, CERN, Geneva, Switzerland, B. Kostka, E. Mashkina, E. Steffens, University of Erlangen, Germany, A. Bernhard, D. Wollmann, T. Baumbach, University of Karlsruhe, Germany, *Proceedings PAC* 2007.

At this time, the cooling system of the magnet, which must be kept below a temperature of 4.2 K at all times, in order to function, is typically separated from the cooling system of the beamline, in order to minimize the number of cryocoolers. This solution makes it possible to keep the beamline at a higher temperature in comparison with the magnet, so that the cryocoolers still have sufficient cooling output available to them to equalize the heat input of the beam. Although this has proven itself as a feasible solution, the technical difficulties and the safety of the magnet system could be greatly improved if it were possible to operate the magnet at the same temperature as the beamline.

It is therefore the task of the invention to develop a magnet system for an insertion device in which no complicated winding is necessary and complicated cooling is eliminated, whereby safety problems on the basis of lack of cooling should not occur.

This task is accomplished by means of a high-temperature superconductor (HTS) magnet system for an insertion device, in accordance with the characteristics of the first claim.

Dependent claims reproduce advantageous embodiments of the invention.

The solution according to the invention provides for a coil body that can be structured to be cylindrical, oval, rectangular, square, as a block, consisting of plates, and more of the like. Coaxial poles are disposed on the mantle surface of the coil body, which poles can have different shapes, similar to the coil body. Windings are disposed between the poles, whereby the windings represent an HTS conductor strip.

The problem indicated above is fundamentally solved by means of replacing the low-temperature superconductor wire (LTS) as used in standard magnet systems for superconductive insertion devices with an HTS conductor strip. The HTS conductor strip already becomes superconductive at the temperature of liquid nitrogen (77 K), and the power parameters of the conductor can increase significantly at lower temperatures.

However, because of its geometry and other mechanical properties, the conductor cannot be wound in just any desired manner, and therefore the winding method and arrangement are restricted for this type of conductor, as compared with LTS material. Nevertheless, first magnets made from HTS conductors are being produced, such as, for example, a sextupole at the National Synchrotron Lightsource Source in the USA ("Insertion Devices R&D for NSLS-II," T. Tanabe, D.A. Harder, G. Rakowsky, T. Shaftan, and J. Skaritka, National Synchrotron Light Source-II, Brookhaven National Laboratory, Upton, New York, USA, Proceedings Pac 2007). This magnet is responsible for focusing of the particle beam in an accelerator. It generates a magnetic field that also reverses in direction periodically, but, in contrast to an undulator, not in planar manner, but rolled up, so that a star shape is formed. In order to achieve this, poles are applied to a yoke that is closed in itself and forms a kind of circle, on the mantle surface that faces inward; these poles do not lie coaxial to the present invention are disposed coaxially on them. Likewise, the pole is generally used as a coil body for such a magnet, and the coils are wound about this body. The coils are wound as so-called double pancakes, so that both electrical contacts lie on the outer radius of the coil. As has already been mentioned, in contrast to this, a planar magnetic field is necessary for an undulator, as shown in FIGS. 1 and 2, which requires a straight and planar coil body. The coils in the present application correspond to this concept and are wound coaxially, whereby the electrical contacting takes place at the inner and the outer radius of the coil, in each instance.

In the solution found, multiple, preferably two, in each instance, HTS conductor strips are connected with one another by means of a connecting part, in such a manner that an opposite current flow (FIG. 2), (FIG. 4) is generated in the connected coils, in order to produce the desired magnetic field configuration.

The intentional use of so many connecting parts, which generate heat input into the system, differs conceptually and fundamentally from the previous LTS-based insertion device concept. The additional heat loads that result from this can only be tolerated because an HTS conductor can be operated with a greater safety range with regard to the critical temperature.

It is advantageous to wind the HTS conductor strip onto the mantle surface of the coil body, in parallel, at the same time with an insulation strip that lies underneath it. The conductor strip advantageously has a rectangular or similar cross-section.

The proposed solution presumes two recognitions: A new winding scheme for generating the required magnetic field configuration, and the use of HTS conductor strip for the magnet system, such as undulators, wigglers, and insertion devices having an application-relevant length.

Furthermore, it is advantageous to structure the coil body in cylinder shape and to disposed coaxial poles on the mantle surface. A recess for the connecting part should be disposed between the ring-shaped poles.

Furthermore, it is advantageous to dispose an upper connecting piece on the finished, wound coil body.

In the following, the invention and the state of the art will be explained in greater detail using an exemplary embodiment and six figures. The figures show:

FIG. 1: Fundamental principle of an undulator with a magnetic south and north pole, with electrons and emitted photons FIG. 2: Function principle of an insertion device with magnetic coils FIG. 3: Schematic representation of a superconductive insertion device with cryocooler(s) for beamline and magnet FIG. 4: Schematic representation of the winding layers on the yoke of the coil body of FIG. 5, with rotation symmetry FIG. 5: Front view of a coil body and the start of a winding with two conductors on a connecting piece FIG. 6: Front view of a finished, wound coil body, on which the upper connecting pieces were affixed.

Figure 3:
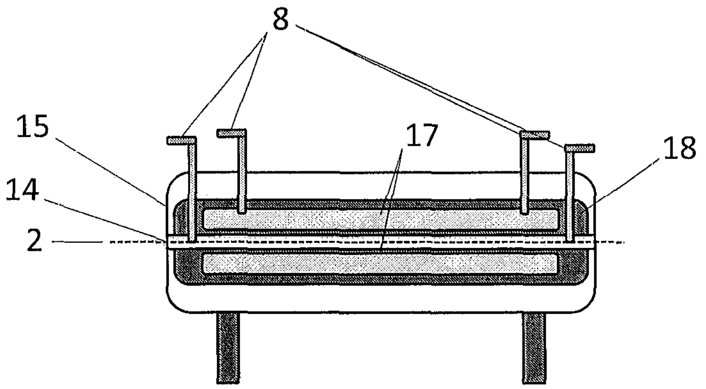

FIGS. 1 and 2 show the fundamental principle according to which undulators known according to the state of the art work. FIG. 3 shows a superconductive insertion device that is the state of the art.

FIG. 1 shows the fundamental principle of an undulator with an electron 1 on the radiation axis 2, whereby north and south poles 4 of the magnetic field are disposed above and below the radiation axis 2. The apparatus, which is shown as a detail, generates a periodically alternating magnetic field on the beam axis 2, whereby the period length is precisely defined. While the electrons 1 pass through the field, they are forced onto an oscillating trajectory by this field configuration, and therefore emit synchrotron radiation 5 of the electron.

FIG. 2 shows a detail of two coil bodies 6 of a magnet system having the functional principle of an insertion device with magnet coils 9, 11 that have current flowing through them in opposite directions, the magnetic flow 10, 12 of which coils is amplified in the poles 9, 11. The coil bodies 6 with magnet coils 9, 11 are disposed opposite one another, whereby the beam axis 2 passes through between the coil bodies 6 with poles. The magnetic flow 10, 12 generated by the magnet coils 9, 11 generates a magnetic field, for which the greatest magnetic field vector 7, in each instance, between the coil bodies 6 was drawn in.

FIG. 3 shows the schematic representation of a superconductive insertion device having the cryocooler 8 on the beamline 14, through which the beam axis 2 passes. Cryostat 15, the undulator magnet 17 consisting of the upper and the lower yoke, as well as the cold mass 18 can also be derived from the figure. The disadvantages and the method of functioning of this apparatus have already been described.

Figure 4:
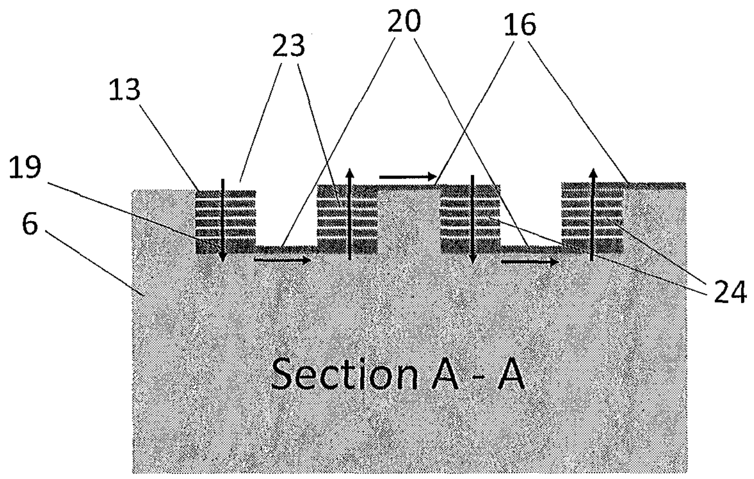
Figure 5:
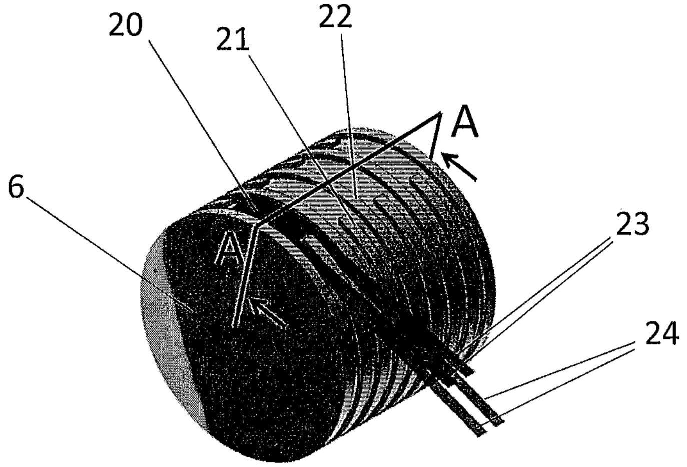

FIG. 4 schematically shows the partial section A-A of the coil body 6 of FIG. 5 with elevations, whereby HTS winding packages 13 are disposed in individual layers 23, 24, one on top of the other, consisting of HTS conductor strip 23 and insulation film 24. These layers represent the field-producing magnetic coils with different current application, in which the direction 19 of the current flow through the coils was drawn in. The connecting piece 16, 20 is disposed between the coils, at the top and bottom, so that current flow can take place.

FIG. 5 shows the coil body 6 for the solution according to the invention, in a front view, with multiple continuous poles 22, with the sectional progression A-A. The connecting piece 20 at the beginning of the winding, in a recess on the pole 21, can be seen between the continuous poles 22, whereby the connecting piece 20 connects two HTS conductor strips 23 to form a pair with one another, underneath which an insulation film pair 24 is situated. A pole 21 with recess is disposed between the pairs 23, 24, in each instance.

The new winding scheme shown in FIG. 4 and described makes it possible to wind all the coils in the same direction, as can be seen in FIG. 5.

The alternating magnetic field structure, which is typical for an undulator or winding, results from the correct connection of the coils with one another, in order to thereby control the current flow in such a manner, as shown in FIG. 4, that current flow in opposite directions is produced.

According to the new winding scheme (see FIG. 5), the shiny HTS conductor strip 23 is wound onto the coil body 6 at the same time with an insulation strip 24, in parallel. Before winding, two conductor strips 23 are soldered onto a small HTS plate 20, in order to thereby connect them electrically. The small plate is glued onto the coil core 6, in order to thereby be able to build up tension during the winding process. The two conductors 23 are wound simultaneously, parallel to one another and with the insulation films 24. When the winding process of the two coils has been completed, the conductor strip is fixed in place and cut off, in order to wind two new coils. The pole elevations 21 of the coil body 6 have recesses where one of the lower connecting pieces 20 must lie, and continuous pole elevations 22 where the coil segments 25 are electrically connected with one another by way of a connecting piece that lies on top.

Figure 6:
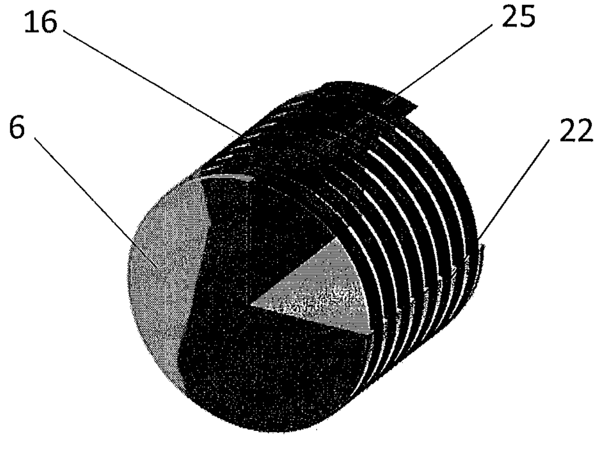

FIG. 6 shows how the two coils are connected with the two preceding ones, in order to generate the electrical flow as shown in FIG. 4. This method of procedure simplifies the winding process greatly, and individual coil pairs can be replaced, if necessary, by means of the modular arrangement. The scheme can be applied to every possible configuration of an HTS magnet system of an insertion device, and is therefore also suitable for use in so-called free electron lasers and other light sources based on particle accelerators.

The invention claimed is:

1. High-temperature superconductor (HTS) magnet system, preferably for an insertion device for generation of high-intensity synchrotron radiation, consisting of the coil body (6), on the mantle surface of which poles with windings that lie between them are disposed, wherein field-reinforcing poles (21, 22) are disposed coaxially on the coil body (6), at least one HTS conductor strip pair (23) is wound onto the coil body (6) between the poles (22), to form an HTS winding package (13), between which package another pole (21) is disposed, adjacent HTS winding packages (13) or sections are electrically connected with one another in such a manner that the current flow runs in opposite directions, in each instance.

2. HTS magnet system according to claim 1, wherein at least two HTS conductor strip pairs (23) are connected with one another by means of a connecting part (20, 16) and wound.

3. HTS magnet system according to claim 2, wherein the HTS conductor strip pairs (23) are wound onto the mantle surface of the coil body (6) with an insulation strip (24) disposed underneath, in parallel.

4. HTS magnet system according to claim 1, wherein the coil body (6) has a cylindrical shape.

5. HTS magnet system according to claim 1, wherein a recess for the connecting part (20) is disposed between the coaxial poles (22).

6. HTS magnet system according to claim 1, wherein an upper connecting piece (16) is disposed on the finished, wound coil body (6).

* * * * *